(12) United States Patent
Bagga et al.

(10) Patent No.: US 10,855,253 B2
(45) Date of Patent: Dec. 1, 2020

(54) FILTER

(71) Applicant: NOVELDA AS, Kviteseid (NO)

(72) Inventors: Sumit Bagga, Oslo (NO); Kristian Granhaug, Oslo (NO)

(73) Assignee: Novelda AS, Oslo (NO)

( * ) Notice: Subject to any disclaimer, the term of this patent is extended or adjusted under 35 U.S.C. 154(b) by 0 days.

(21) Appl. No.: 16/326,471

(22) PCT Filed: Aug. 17, 2017

(86) PCT No.: PCT/GB2017/052444
§ 371 (c)(1),
(2) Date: Feb. 19, 2019

(87) PCT Pub. No.: WO2018/033746
PCT Pub. Date: Feb. 22, 2018

(65) Prior Publication Data
US 2019/0356303 A1    Nov. 21, 2019

(30) Foreign Application Priority Data

Aug. 19, 2016    (GB) .................................... 16142416

(51) Int. Cl.
*H03H 11/04*    (2006.01)
(52) U.S. Cl.
CPC .................. *H03H 11/04* (2013.01)
(58) Field of Classification Search
CPC ............. H03F 3/45475; H03F 3/45183; H01L 2924/00; H03H 11/04; H03H 11/06; H03H 7/03; H03H 7/1766; H03H 7/0115
See application file for complete search history.

(56) References Cited

U.S. PATENT DOCUMENTS 4,459,571 A * 7/1984 Fraser .................. H01P 1/2053
333/202
5,451,915 A    9/1995 Katzin et al.
(Continued)

FOREIGN PATENT DOCUMENTS

EP         0 794 610 A1    9/1997
WO    WO 2005/060043 A2    6/2005

OTHER PUBLICATIONS

European Search Report under Section 17(5) for GB 1614241.6, dated Feb. 21, 2017, 5 pages.
(Continued)

*Primary Examiner* — Sibin Chen
(74) *Attorney, Agent, or Firm* — Klarquist Sparkman, LLP

(57) ABSTRACT

A circuit comprising: a passive reactive component; and an active circuit, the active circuit arranged to increase the ac voltage difference across the reactive component by changing the current at an input to the reactive component and the current at an output of the reactive component by equal and opposite amounts. By increasing the current on one side of the resonant circuit and decreasing the current on the other side of the resonant circuit, the amount of current flowing through the resonant circuit is increased and thus the ac voltage difference across the inductor of the LC resonant circuit is increased. The Q of an inductor (the ratio of its imaginary to real impedance) is increased. In a filter, the improved Q provides a sharp, high rejection notch and faster pass-band to stop-band roll-off, thus improving the frequency response of the circuit.

22 Claims, 9 Drawing Sheets

(56) References Cited

U.S. PATENT DOCUMENTS

| | | | |
|---|---|---|---|
| 6,271,716 B1* | 8/2001 | Nayebi | H03L 7/0895 |
| | | | 323/316 |
| 6,944,435 B2 | 9/2005 | Contopanagos et al. | |
| 7,509,102 B2* | 3/2009 | Rofougaran | H03C 5/00 |
| | | | 330/10 |
| 8,497,730 B1 | 7/2013 | Wyse | |
| 8,581,643 B1* | 11/2013 | Schmitt | H03L 7/07 |
| | | | 327/147 |
| 2001/0033119 A1* | 10/2001 | Nguyen | H03H 3/0078 |
| | | | 310/309 |
| 2002/0186099 A1* | 12/2002 | Sengupta | H01P 1/20 |
| | | | 333/174 |
| 2003/0224746 A1 | 12/2003 | Contopanagos et al. | |
| 2006/0017515 A1 | 1/2006 | Nebojsa et al. | |
| 2007/0236280 A1 | 10/2007 | Tzuang et al. | |
| 2008/0032661 A1 | 2/2008 | Adedayo et al. | |

OTHER PUBLICATIONS

International Search Report and Written Opinion for PCT/GB2017/052444, dated Jan. 22, 2018, 23 pages.

\* cited by examiner

FILTER

CROSS REFERENCE TO RELATED APPLICATIONS

This is the U.S. National Stage of International Application No. PCT/GB2017/052444, filed Aug. 17, 2017, which was published in English under PCT Article 21(2), which in turn claims the benefit of Great Britain Application No. 1614241.6, filed Aug. 19, 2016.

The invention relates to high-pass filters, typically for use in radio frequency systems, most particularly in relation to filters employed to exclude frequencies at and below wireless LAN.

High-pass filters are commonly used in RF radio front-ends to exclude unwanted frequencies from further processing, e.g. to remove interferers. With the ever increasing number of wirelessly communicating devices and limited spectrum resources, interference can be a big problem. For optimal operation and co-existence, it is therefore all the more important to heavily exclude those areas of spectrum that are not of interest.

One particular area of interest is the UWB spectra. The usable spectrum varies from region to region, e.g., in the US, transmissions may use the 3.1 to 10.6 GHz band. In Europe, transmissions may use the 6 to 8.5 GHz band. It will be appreciated that for use of these spectrum bands, rejection of IEEE 802.11 wireless LAN frequencies (2.4 GHz and 5 GHz) becomes very important.

For high volume production on inexpensive products, the hardware cost is also a very important factor.

Typically to improve the response (e.g., low insertion loss, fast pass-band to stop-band transition, group delay, etc.) of a passive filter (of a given order), it is desired to use high Q-factor (Q) components. Higher Q components for said filter result in faster pass-band to stop-band roll-off (the transition band), sharper notches and lower insertion loss. However, the best quality components (with the highest Q values) are expensive. For example, to improve the Q of an inductor/coil, thicker wires (with lower intrinsic resistances) are required. In integrated circuits this means depositing thicker layers of metal (e.g., Cu/Al) during fabrication which is a time consuming process, and thus expensive. Similarly, the highest Q value capacitors use MIM (metal-insulator-metal) technology and are significantly more expensive than the cheaper MOM (metal-oxide-metal) components. Therefore high quality passive filters generally require expensive components to achieve low insertion loss and fast pass-band to stop-band transition and high in-band and/or out-of-band rejection. In addition, the higher quality components are typically less affected by process, voltage and temperature (PVT) variations, i.e. they are more tolerant to production spread and environmental factors.

Fast frequency transitions are important in UWB applications as it is desirable for such applications to use as much as possible of the available spectrum. If the pass-band to stop-band roll-off of the filter is less abrupt, then a high rejection notch placed at the lower end of the pass-band will eat into the usable spectrum. A trade-off then has to be made between higher rejection at the upper end of the stop-band versus lower rejection at the lower end of the pass-band. A high Q filter with faster frequency transitions allows the best of both worlds.

Other solutions for increasing the sharpness of a passive filter profile include employing higher order filters (i.e., more reactive components). However, additional components generally require more chip area which adds to the cost and may result in higher insertion loss and/or power consumption.

According to one aspect of the invention there is provided an electronic circuit comprising a resonant circuit formed from an inductive component in parallel with a capacitive component; wherein the capacitive component is a varactor.

A varactor is basically a variable capacitor. As the bias voltage applied across the varactor is changed, its capacitance changes, thus making it a voltage controlled capacitor. The varactor (a technology dependent component) can be more robust with respect to PVT variations, typically having more tolerance than MOM/MIM capacitors. The varactor can have high Q and high capacitance density, thus not requiring expensive components, such as MIM capacitors. For the nominal desired capacitance, a high Q varactor as a 2 terminal (gate and drain-source-bulk) MOS transistor is optimized for minimum channel width and length and maximum number of gate fingers. The Q increases with technology and geometry scaling as for a finer-pitch technology node, one can implement a given capacitance on a smaller physical area. Q is basically limited by the parasitic resistance in the device, and smaller physical area translates to reduced parasitic resistance. Preferably the varactor is optimized for high Q by optimizing the channel width, length and number of gate fingers.

The electronic circuit may be any of a number of different types of circuit. For example it may be an amplifier. However, in preferred embodiments the electronic circuit is a filter. This may be any type of filter such as a low-pass filter or a band-pass filter for example, but in some preferred embodiments it is a high-pass filter.

The resonant circuit forms a single harmonic trap with a notch frequency defined by the component values of the inductor and varactor. By reducing the PVT variation of the varactor, the harmonic trap frequency formed by the electronic circuit is more accurately defined. In particular, the high Q and tolerance to PVT variations of the varactor means that the notch is sufficiently well defined that further trimming circuits are not required in order to adjust the notch frequency, e.g. to compensate for PVT variations.

In preferred embodiments an input of the resonant circuit and an output of the resonant circuit are connected to the same dc potential. In the absence of other components, this has the effect of biasing the varactor with zero dc potential difference (across its terminals), thus keeping its capacitance constant. This is contrary to the normal use of varactors as variable capacitors. However, the main benefits of using a varactor in this arrangement are its high Q (realized by optimizing the device geometry for minimum series resistance, i.e. increasing the metal area/cross-section of the connections) and robustness to PVT variations. These benefits are best achieved when the capacitance of the varactor is constant, i.e., when the dc voltage across the varactor is zero.

In some preferred embodiments an input of the resonant circuit may be connected to a second inductive component and an output of the resonant circuit may be connected to a third inductive component. In the case of a filter, these extra inductive components add to the order of the filter, thus improving its frequency response. They may be simple inductors or may be part of a transformer, including multi-winding transformers or single winding transformers such as auto-transformer or centre-tapped inductors. The second and third inductive components may connect the resonant circuit to the same dc potential. As discussed above, these connections to the same dc potential can be used to keep a constant varactor capacitance.

In alternative arrangements the second and third inductive components may connect the resonant circuit to different dc potentials. This would have the effect of biasing the varactor at a different potential, and would provide flexibility to vary one or both potentials so as to vary the capacitance of the varactor. Varying the capacitance of the varactor will tune the resonance frequency. This may be desirable, e.g. to tune a device for different regions, for example where a broader stop-band is required by regional regulations. It will be appreciated that some other form of varactor biasing circuit may be added to allow for varactor tuning, but the above arrangement is convenient. The addition of a second potential may also add to hardware complexity. Thus, where varactor tuning is not required, the single common connection to bias the varactor with no dc voltage drop is preferred.

As mentioned above, the second and third inductive components may be inductors/coils or centre-tapped inductors or auto-transformers. The centre taps may be connected to the same potential as discussed above. This connection may be to the power supply voltage, $V_{DD}$. The use of centre-tapped inductors or auto-transformers is particularly beneficial in differential filters where a single centre-tapped winding can be used for the positive and negative half-circuits of the differential filter, e.g., the single winding being preferably symmetrically tapped and the positive and negative signal parts of the filter being symmetrical about the centre tap.

Accordingly, in some preferred embodiments the electronic circuit is arranged for a differential signal and the electronic circuit comprises: a first resonant circuit formed from an inductive component in parallel with a varactor; and a second resonant circuit formed from an inductive component in parallel with a varactor; and wherein the first resonant circuit is arranged for receiving a positive part of the differential signal and the second resonant circuit is arranged for receiving a negative part of the differential signal.

With the differential arrangement, a single dc biasing connection can be used to bias both varactors to have a zero potential difference across them. This is highly efficient from a chip area perspective as well as having the above-mentioned advantages of high Q for faster pass-band to stop-band roll-off and tolerance to PVT variations.

Preferably an input of the first resonant circuit is connected to an input of the second resonant circuit through a second inductive component and wherein an output of the first resonant circuit is connected to an output of the second resonant circuit through a third inductive component. Although two (or more) separate inductors could be used for this connection, preferably the second and third inductive components are centre-tapped inductors or autotransformers. Using a single centre-tapped (and preferably symmetrically centre-tapped) winding as part of both the positive and negative halves of the differential filter is area efficient. As discussed above, the centre taps of the second and third inductive components may be connected to the same dc potential.

It will be appreciated that any form of LC filter may be used. However, as sharp roll-off is key to many applications (particularly wireless LAN rejection for UWB radio applications), the electronic circuit is preferably an elliptic filter. In some preferred embodiments the filter is a fifth-order filter although it will be appreciated that the invention is not limited to a particular order of filter.

The circuit described above is purely passive and therefore lossy in nature. Further improvement can be made with the addition of an active circuit to boost the Q of some inductive components. Enhancing the Q of the inductive components and using a varactor, particularly a varactor with no dc bias, gives a well-defined and improved level of rejection at the harmonic trap frequency and provides steeper pass-band to stop-band roll-off.

Previous efforts to use active circuits for Q-boosting have been based around the "negative R" or "negative $g_m$" principle ($g_m$ being transconductance). In these arrangements inputs from the different arms of a differential circuit (i.e. out of phase inputs) are used to inject current onto the different arms of a differential circuit (i.e. out of phase outputs) in a positive feedback manner. An example is illustrated in FIG. 9 with the inputs and outputs labelled to indicate how they would be applied to nodes of the circuit shown in FIG. 3. The two transistors are driven by nodes A and C (being on different arms of the differential circuit such that they are out of phase) and the outputs are also applied to nodes A and C, i.e. also applied to different arms of the differential circuit and thus applied to out of phase signal paths. This creates a cross-coupled arrangement as shown in FIG. 9. To describe the operation of this negative-$g_m$ circuit, when the signal at node A is positive, the signal at node C will be negative. Node A drives the transistor $M_1$ which causes an increased current draw from node C, thus pulling the signal at C further negative. At the same time, the negative signal at node C drives transistor $M_2$ which reduces the current draw from node A, thus causing an increase in the signal at node A. This is positive feedback. However, this circuit can easily become unstable if $-2/g_m$ becomes larger than the resistance of the resonant circuit. This can lead to unwanted oscillations which cause operational problems with the circuit to which this active circuit is applied.

Therefore in preferred embodiments the electronic circuit further comprises an active circuit, the active circuit being arranged to increase the ac voltage difference across the first resonant circuit by changing the current at an input to the first resonant circuit and the current at an output of the first resonant circuit by equal and opposite amounts, and the active circuit being arranged to increase the ac voltage difference across the second resonant circuit by changing the current at an input to the second resonant circuit and the current at an output of the second resonant circuit by equal and opposite amounts.

By increasing the current on one side of the resonant circuit (i.e. injecting current into that side) and decreasing the current on the other side of the resonant circuit (i.e. drawing current out of that side of the circuit), the amount of current flowing through the resonant circuit is increased and thus the ac voltage difference across the inductor of the LC resonant circuit is increased. The Q of an inductor is defined as the ratio of its imaginary to real impedance. The active circuit is arranged to increase the ratio of the imaginary part to the real part of the impedance of said inductor. The quality factor is also defined as the ratio of the voltage drop appearing across the inductor or capacitor to the supply/bias voltage. Although this comes at the cost of power consumption for the active circuit, the improved Q of the inductive components provides a sharp, high rejection notch and faster pass-band to stop-band roll-off, thus improving the frequency response of the circuit.

If the node at the input of the resonant circuit and the node at the output of the resonant circuit see the same impedance then the equal and opposite current changes will cause equal and opposite voltage changes. However where these nodes see different impedances the voltage changes will not be the same. The voltage changes on the input and output side of the resonant circuit will be opposite in sign, but may not necessarily be equal in magnitude. As the current is injected into and drawn off the same signal path (i.e. the same signal arm of a differential circuit), the overall current flow through the signal path as a whole is not changed. Also, unlike the negative-$g_m$ technique discussed above, the current changes applied to either side of the resonant circuit are applied to nodes at which the signal is in phase. This arrangement ensures overall stability and is more resilient to process, voltage and temperature variations.

Therefore in some embodiments the electronic circuit further comprises an active circuit, the active circuit being arranged to increase the ac voltage difference across the first resonant circuit by changing the voltage at an input to the first resonant circuit and an output of the first resonant circuit by equal and opposite amounts, and the active circuit being arranged to increase the ac voltage difference across the second resonant circuit by changing the voltage at an input to the second resonant circuit and an output of the second resonant circuit by equal and opposite amounts.

More specifically, in some preferred embodiments the electronic circuit may further comprise an active circuit, the active circuit comprising:
 a first current source arranged to draw current through a first amplifying element from the output of the first resonant circuit and arranged to draw current through a second amplifying element from the input of the first resonant circuit, the first amplifying element being driven by the input to the first resonant circuit and the second amplifying element being driven by the input of the second resonant circuit; and
 a second current source arranged to draw current through a third amplifying element from the output of the second resonant circuit and arranged to draw current through a fourth amplifying element from the input of the second resonant circuit, the third amplifying element being driven by the input of the second resonant circuit and the fourth amplifying element being driven by the input of the first resonant circuit.

The inputs to the resonant circuits are preferably the positive and negative signal inputs of the differential signal (e.g. applied from the antenna). Each differential amplifier (comprising amplifying elements) for one resonant circuit is driven by these signals and therefore the current drawn through the amplifying elements is varied according to the out of phase differential signals, thus varying the current draw on either side of the resonant circuit by equal and opposite amounts. Thus as one side of the resonant circuit is raised in voltage, the other side of said circuit is necessarily lowered in voltage. A key benefit of this is that the same amount of energy that is added on one side of the resonant circuit is removed on the other side of said circuit. This guarantees unconditional stability of the circuit.

Preferably the first, second, third and fourth amplifying elements are inverting and arranged in common-source configuration. More preferably the first, second, third and fourth amplifying elements are FETs, e.g. MOSFETs, each being driven by the voltage at its respective gate and with the respective current source being connected to its source.

It will be appreciated that the invention is not limited to a single harmonic trap (i.e. a single resonant circuit) on each arm (positive and negative circuit halves) of the circuit. A double harmonic trap (or higher order harmonic traps) can be created by adding further reactive components in the form of further harmonic traps.

Accordingly, in some embodiments the electronic circuit may further comprise a third resonant circuit in series with the first resonant circuit and a fourth resonant circuit in series with the second resonant circuit.

If the two series connected resonant circuits are designed with substantially the same resonant frequency, then they will add together to form a higher rejection notch with sharper roll-off. Alternatively, the two series connected resonant circuits may have different resonant frequencies so that the frequency response has two notches. By moving the two notches closer together in the frequency domain, a highly effective (wider) stop-band can be realized. The two notches are ideally placed sufficiently close together that the frequency band between the two notches remains below the rejection requirement of the circuit (e.g. filter).

Each of the third and fourth resonant circuits preferably also comprises a varactor as the capacitive component for the same reasons as discussed above, for higher capacitance density and more tolerance to PVT variations.

Again an active circuit may be provided in a similar manner to that described above. However, with the additional resonant circuits, additional Q-boosting differential amplifiers are needed.

Therefore preferably the electronic circuit further comprises an active circuit, the active circuit arranged to increase the ac voltage difference across the first resonant circuit by changing the current at an input to the first resonant circuit and the current at an output of the first resonant circuit by equal and opposite amounts, the active circuit arranged to increase the ac voltage difference across the second resonant circuit by changing the current at an input to the second resonant circuit and the current at an output of the second resonant circuit by equal and opposite amounts, the active circuit arranged to increase the ac voltage difference across the third resonant circuit by changing the current at an input to the third resonant circuit and the current at an output of the third resonant circuit by equal and opposite amounts, and the active circuit arranged to increase the ac voltage difference across the fourth resonant circuit by changing the current at an input to the fourth resonant circuit and the current at an output of the fourth resonant circuit by equal and opposite amounts.

More specifically, the electronic circuit preferably further comprising an active circuit, the active circuit comprising:
 a first current source arranged to draw current through a first amplifying element from the output of the first resonant circuit and arranged to draw current through a second amplifying element from the input of the first resonant circuit, the first amplifying element being driven by the input to the first resonant circuit and the second amplifying element being driven by the input of the second resonant circuit;
 a second current source arranged to draw current through a third amplifying element from the output of the second resonant circuit and arranged to draw current through a fourth amplifying element from the input of the second resonant circuit, the third amplifying element being driven by the input of the second resonant circuit and the fourth amplifying element being driven by the input of the first resonant circuit;
 a third current source arranged to draw current through a fifth amplifying element from the output of the third resonant circuit and arranged to draw current through a sixth amplifying element from the input of the third resonant circuit, the fifth amplifying element being driven by the input to the third resonant circuit and the sixth amplifying element being driven by the input of the fourth resonant circuit; and a fourth current source arranged to draw current through a seventh amplifying element from the output of the fourth resonant circuit and arranged to draw current through an eighth amplifying element from the input of the fourth resonant circuit, the seventh amplifying element being driven by the input of the fourth resonant circuit and the eighth amplifying element being driven by the input of the third resonant circuit.

Preferably the first, second, third, fourth, fifth, sixth, seventh and eighth amplifying elements are inverting and arranged in common-source configuration. Preferably the first, second, third, fourth, fifth, sixth, seventh and eighth amplifying elements are FETs, e.g. MOSFETs, each being driven by the voltage at its respective gate and with the respective current source being connected to its source.

The active circuit described above is believed to be independently inventive. Therefore, according to a further aspect, the invention provides a circuit comprising: a passive reactive component; and an active circuit, the active circuit arranged to increase the ac voltage difference across the reactive component by changing the current at an input to the reactive component and the current at an output of the reactive component by equal and opposite amounts.

As discussed above, in some examples where the impedance either side of the reactive component is the same, the equal and opposite changes in current will result in equal and opposite changes in voltage. Thus according to a further aspect, there is provided a circuit comprising: a passive reactive component; and an active circuit, the active circuit arranged to increase the ac voltage difference across the reactive component by changing the voltage at an input to the reactive component and an output of the reactive component by equal and opposite amounts.

The reactive component may be either an inductive component or a capacitive component. It will be appreciated that the majority of this document focuses on inductive components because they are inherently much lower Q devices and therefore benefit far more from the Q boosting. However, the circuit still does boost the Q of capacitive components to and is therefore also applicable in cases where a capacitive device needs to be Q-boosted.

As has been described above, the active circuit provides equal and opposite current changes either side of the reactive component and therefore energy that is inserted on one side is drawn off on the other, and vice versa, resulting in circuit stability. The result is an increase in the amplitude of the ac voltage across the reactive element, which increases its Q.

As discussed above, the current changes are equal and opposite (i.e. out of phase), so that the overall current in the signal path other than the Q-boosted segment through the reactive component is unaffected. The active circuit is applied across a component on a signal path such that the nodes on the signal path where the active circuit is connected are nodes at which the signal is in phase.

It will be appreciated that the preferred features described above, apply equally to this circuit.

The reactive component may be a standalone component or it may be part of a larger circuit. The reactive component may be part of a resonant circuit. In particular it may be part of a series or parallel resonant circuit. In particular, in the case of an LC parallel resonant circuit, both the inductor and capacitor can be Q-boosted at the same time by the active circuit applied either side of the resonant circuit.

The first and second amplifying elements may be inverting amplifiers and arranged in common-source configuration. The first and second amplifying element may be FETs, each being driven by the voltage at its respective gate and with the respective current source being connected to its source.

Preferably the active circuit comprises: a first current source arranged to draw current through a first amplifying element from the output of the reactive component and arranged to draw current through a second amplifying element from the input of the reactive component, one of the first and second amplifying elements being driven by either the input or the output of the reactive component and the other of the first and second amplifying elements being connected to ac ground.

The active circuit may be applied to a reactive element in a single-ended circuit. However, the active circuit is particularly advantageous when applied to differential circuits, particularly because out of phase drive signals to drive the amplifying elements can be taken from opposite signal arms of the differential circuit. Therefore according to another aspect of the invention, there is provided a differential circuit having a first positive arm and a second negative arm; wherein the first positive arm comprises at least one first inductive component and the second negative arm comprise at least one second inductive component; further comprising: an active circuit, the active circuit arranged to increase the ac voltage difference across the first inductive component by changing the current at an input to the first inductive component and the current at an output of the first inductive component by equal and opposite amounts, and the active circuit arranged to increase the ac voltage difference across the second inductive component by changing the current at an input to the second inductive component and the current at an output of the second inductive component by equal and opposite amounts.

The active circuit can be applied to any differential circuit that employs inductive components that would benefit from Q boosting. The circuit uses the differential nature of the differential circuit to apply the Q boosting across each inductor.

It will be appreciated that many of the features described above may also be features of preferred embodiments of this aspect of the invention. Therefore, for example, the first inductive component may be part of a first resonant circuit and the second inductive component may be part of a second resonant circuit. It will be appreciated that the invention is not limited to parallel resonant circuits, but may be applied equally to series resonant circuits.

A third inductive component may be connected between the input of the first inductive component and the input of the second inductive component; and a fourth inductive component may be connected between the output of the first inductive component and the output of the second inductive component. As described above, the Q boosting active circuit can work equally well on inductive components connected between the two differential circuit halves as well as on the components in each half.

The differential circuit may be any type of circuit, for any of a number of different purposes. Purely by way of example, it may be any of: a high-pass filter, a low-pass filter or an amplifier.

As described above, the active circuit may comprise: a first current source arranged to draw current through a first amplifying element from the output of the first inductive component and arranged to draw current through a second amplifying element from the input of the first inductive component, the first amplifying element being driven by the input to the first inductive component and the second amplifying element being driven by the input of the second inductive component; and a second current source arranged to draw current through a third amplifying element from the output of the second inductive component and arranged to draw current through a fourth amplifying element from the input of the second inductive component, the third amplifying element being driven by the input of the second inductive component and the fourth amplifying element being driven by the input of the first inductive component.

The first, second, third and fourth amplifying elements are preferably inverting amplifiers and arranged in common-source configuration. The first, second, third and fourth amplifying element are preferably FETs, more preferably MOSFETs, each being driven by the voltage at its respective gate and with the respective current source being connected to its source.

According to another aspect of the invention, there is provided a method of increasing the Q of a passive reactive component, comprising: increasing the ac voltage difference across the reactive component by changing the current at an input to the reactive component and the current at an output of the reactive component by equal and opposite amounts.

The voltage change is preferably obtained via an active circuit connected across the reactive component.

It will be appreciated that all of the preferred features described above in relation to the circuit apply equally to this method.

Certain preferred embodiments of the invention will now be described, by way of example only, and with reference to the accompanying drawings in which.

Figure 1:
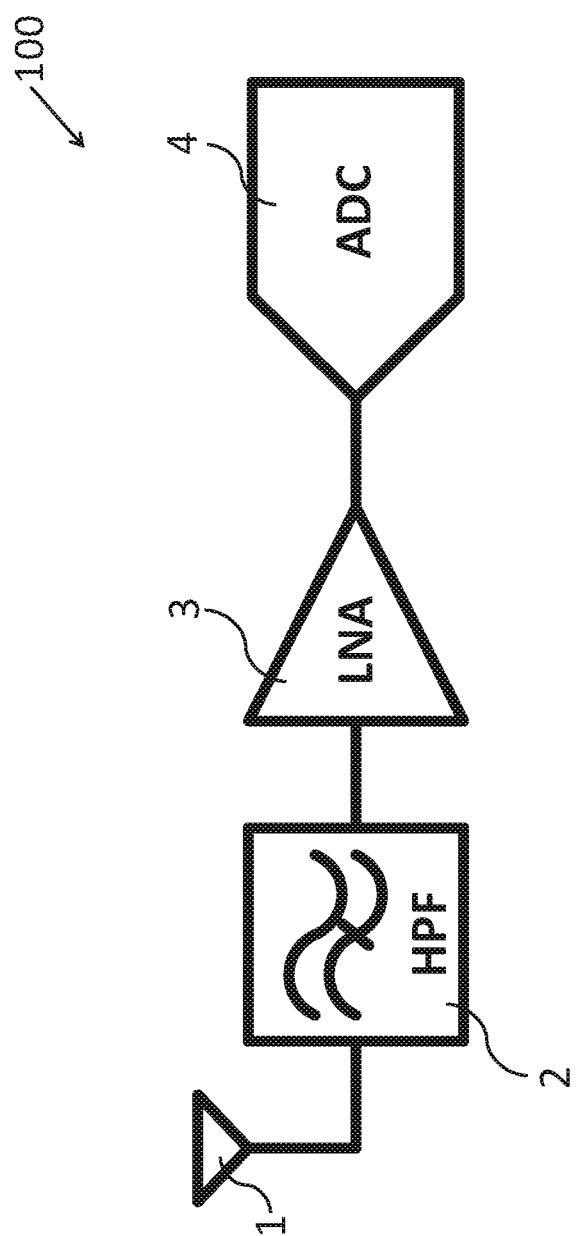
FIG. 1 shows a basic block diagram of a direct sampling receiver front-end suitable for wideband signal processing.

FIG. 1 depicts a typical direct sampling receiver front-end 100 for a wideband receiver operating for example in the 6 to 8.5 GHz band. Antenna 1 receives a RF signal and passes it to high-pass filter 2 which rejects signals below about 6 GHz, with a high rejection notch at around 5.1 to 5.8 GHz (although it will be appreciated that these numbers are provided purely by way of example). The output of high-pass filter 2 feeds to the input of low-noise amplifier 3 which provides gain for the signal of interest across the operating band of 6 to 8.5 GHz. The output of low-noise amplifier 3 is then fed to an analogue-to-digital converter (ADC) 4 that finally digitises the RF signal.

Figure 2:
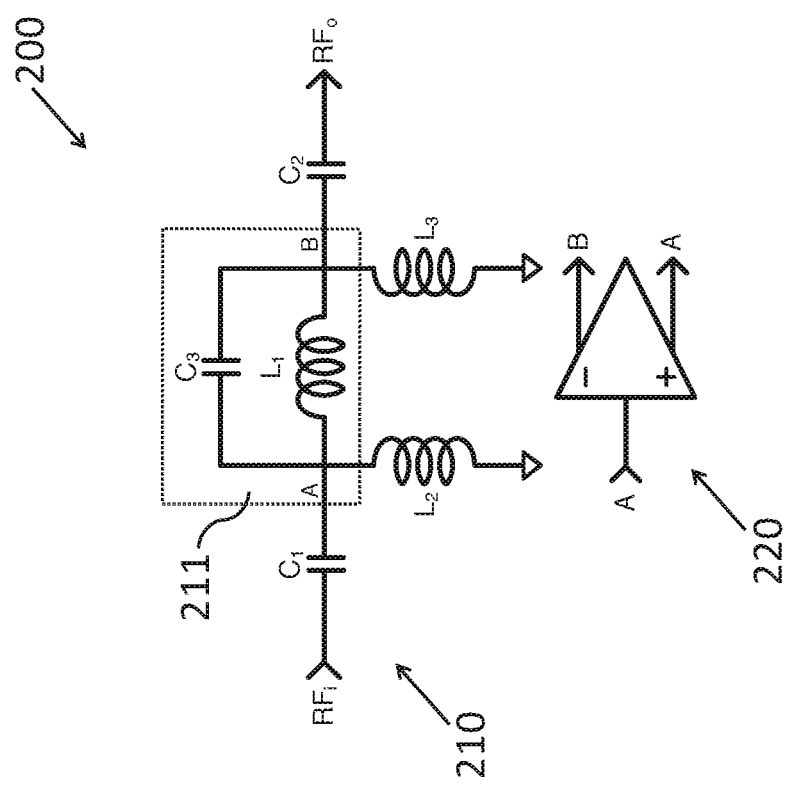
FIG. 2 shows a single-ended high-pass filter according to an embodiment of the invention, employing a single harmonic trap.

FIG. 2. shows a high-pass filter 200 according to an embodiment of the invention. The passive filter core 210 is depicted as a single-ended filter, operating on a signal part (signal path) $RF_i$.

The passive filter core 210 is a fifth-order elliptic LC ladder filter with a resonant circuit 211 as one of its reactive elements. The other four reactive elements (to make up a fifth-order filter) are capacitor $C_1$, inductor $L_2$, inductor $L_3$ and capacitor $C_2$. The resonant circuit 211 comprises an inductor $L_1$ and a capacitor $C_3$ in parallel.

The capacitor $C_3$ of resonant circuit 211 is connected between nodes A and B. As can be seen in FIG. 2, nodes A and B are both connected to ac ground nodes. Node A is connected through inductor $L_2$ and node B is connected through inductor $L_3$. The signal passing from $RF_i$ to $RF_0$ is in phase at nodes A and B.

The active block 220 is a single-ended to differential Q-boosting circuit that enhances the Q of the inductive components ($L_1$, $L_2$ and $L_3$) of the circuit so as to improve the notch rejection of the filter and provide improved (steeper) pass-band and stop-band roll-off. The active block 220 has a single-ended input and provides differential output (both inverting and non-inverting outputs). The single-ended input is connected to node A on the input side of the resonant circuit 211 so that this node A drives the active block 220. The differential outputs (which are out of phase) are connected at nodes A and B (where the signal path is in phase), i.e. either side of the resonant circuit 211. Providing the differential outputs either side of the reactive components of the resonant circuit 211 increases the current (and thus the voltage) on one side and decreases it on the other side, thus increasing the voltage drop across the components (and hence the Q of the components), while retaining stability of the circuit. The change in current due to the active circuit on one side of the resonant circuit 211 is equal and opposite to the change in current due to the active circuit on the other side of the resonant circuit 211 so that the energy added on one side is removed on the other side, thus providing circuit stability. It will be appreciated that the input of active block 220 could alternatively be driven by node B instead of node A and the differential inputs could be applied the opposite way round (with the inverting output connected at A and the non-inverting output connected at B).

The Q of an inductor is defined as the ratio of its imaginary to real impedance. The active circuit is arranged to increase the ratio of the imaginary part to the real part of the impedance of said inductor. The quality factor is also defined as the ratio of the voltage drop appearing across the inductor or capacitor to the supply/bias voltage. An increase in voltage drop seen across the inductor, means an increase in its Q.

Figure 3:
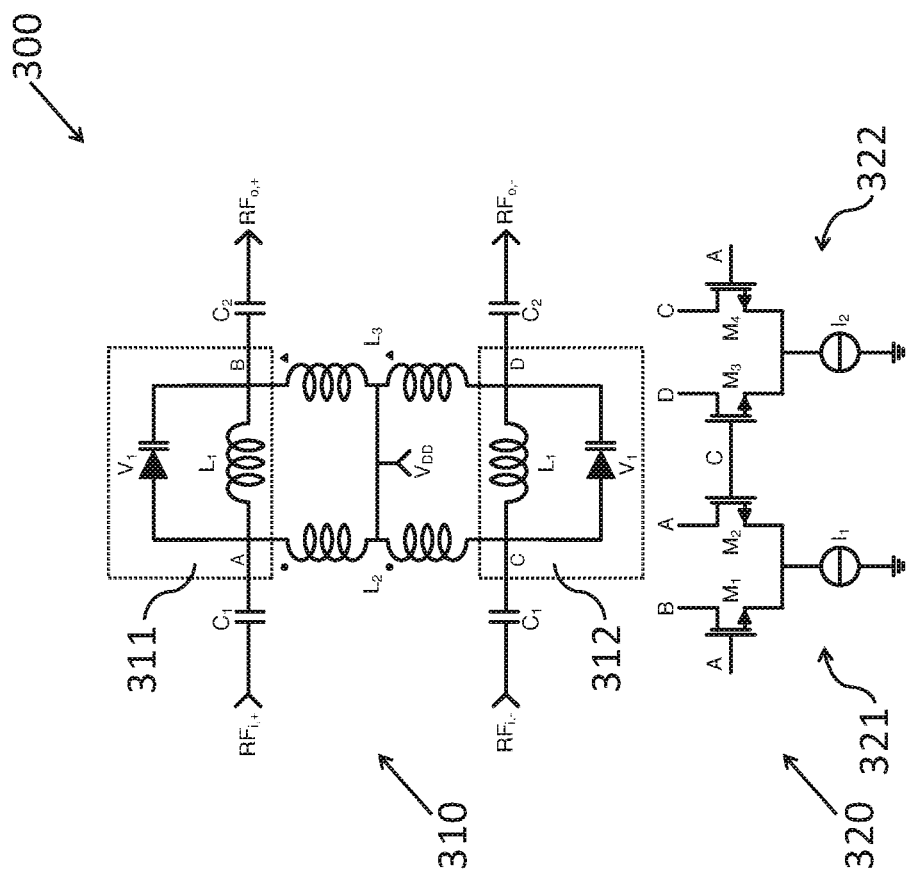
FIG. 3 shows a differential high-pass filter according to an embodiment of the invention, employing a single harmonic trap.

FIG. 3 shows a high-pass filter 300 according to an embodiment of the invention. The circuit 300 is divided into two parts with the upper part being the passive filter core 310 and the lower part being the active circuit 320.

The passive filter core 310 is depicted as a differential filter, operating on a positive signal part $RF_{i,+}$ and a negative signal part $R_{i,-}$. Although a differential filter is shown and described here, it will be appreciated that half of this circuit can be used as a single-ended filter as shown in FIG. 2.

Each half of the passive filter core 310 is a fifth-order elliptic LC ladder filter with a resonant circuit (311 for the positive signal half and 312 for the negative signal half) as one of its reactive elements. The other four reactive elements (to make up a fifth-order filter) are capacitor $C_1$, center-tapped inductor $L_2$ (or more generally, just an inductor), center-tapped inductor $L_3$ (or more generally, just an inductor) and capacitor $C_2$.

Each resonant circuit 311, 312 comprises an inductor $L_1$ and a varactor $V_1$ in parallel. The varactor $V_1$ is used in place of a more traditional capacitor due to its high Q, capacitance density and robustness with respect to process variations, voltage variations and temperature variations (collectively referred to as PVT variations). The varactor $V_1$ has a tolerance better than or comparable to metal-insulator-metal (MIM) capacitors, but without requiring the more expensive MIM fabrication process. Metal-oxide-metal (MOM) capacitors are cheaper to construct than MIM capacitors, but suffer typically ±15% PVT variation which adversely affects the filter performance on account of variability of notch frequency under PVT variations.

The varactor $V_1$ of resonant circuit 311 is connected between nodes A and B. As can be seen in FIG. 3, nodes A and B are both connected to $V_{DD}$ and are in phase on the signal path. Node A is connected through inductor $L_2$ and node B is connected through inductor $L_3$. As there is no (or insignificantly small) voltage drop across these inductors, both sides of varactor $V_1$ are held at $V_{DD}$ and therefore there is zero dc bias applied to varactor $V_1$. This has the significant advantage of keeping the capacitance of the varactor constant, providing a well-defined capacitance value that is least susceptible to PVT variations.

The inductors $L_2$ and $L_3$ are centre-tapped inductors exploiting mutual coupling in order to reduce chip area. Preferably $L_2$ and $L_3$ are identical components so as to ensure that any voltage losses across them are also identical.

As well as being part of the fifth-order filter, capacitors $C_1$ and $C_2$ dc isolate the filter core and the $V_{DD}$ connection from the antenna input and downstream processing. This is particularly beneficial in relation to the active Q-boosting circuit described further below as $C_1$ and $C_2$ guarantee self-biasing (at $V_{DD}$) of the differential amplifiers in the active Q-boosting circuit.

Inductors $L_1$ in the two resonant circuits can be replaced with a bifilar (transformer) to exploit mutual coupling and further reduce chip area.

The negative (inverting) signal half of the filter is identical to the positive (non-inverting) signal half described above, except that the varactor $V_1$ of second resonant circuit 312 is connected between nodes C and D which are connected to $V_{DD}$ through the center-tapped inductors $L_2$ and $L_3$, respectively.

The active circuit 320 is a Q-boosting circuit that enhances the Q of the inductive components of the circuit so as to improve the notch rejection of the filter and provide improved (steeper) pass-band and stop-band roll-off.

Previous efforts to provide Q-boosting across inductors have involved providing a negative resistance in parallel with the inductor so as to effectively reduce the series resistance of the inductor. However such arrangements over PVT variations may cause the filter to become unstable.

The active circuit 320 comprises two differential amplifiers. A first differential amplifier 321 is connected across the first resonant circuit 311 via nodes A and B. The second differential amplifier 322 is connected across the second resonant circuit 312 via nodes C and D. First differential amplifier pair 321 comprises amplifying elements $M_1$ and $M_2$ (here in the form of MOSFETs, self-biased at $V_{DD}$ to operate in the saturation region).

The gate of amplifying element $M_1$ is connected to (and therefore driven by) node A, i.e. the input of the first resonant circuit 311. The gate of amplifying element $M_2$ is connected to (and therefore driven by) node C, i.e. the input of the second resonant circuit 312. As the two gates are driven by out of phase signals (being taken from opposite differential signals), amplifying elements $M_1$ and $M_2$ operate in anti-phase. The sources of both amplifying elements $M_1$ and $M_2$ are connected together and to current source which draws current ($0.5 1 \ast I_1$) through each of the amplifying elements $M_1$ and $M_2$. Any change in the input signals causes one amplifying element to draw more current and the other amplifying element to draw equivalently less current. Accordingly, any current injected at A is drawn off at B and vice versa.

To describe the operation of first differential amplifier 321 by way of example, an increase in signal voltage at node A is mirrored by a corresponding signal voltage drop at node C. As the voltage at node A rises, the amplification of amplifying element $M_1$ is increased, resulting in more current draw at node B and a corresponding decrease in voltage at node B. Simultaneously, as the voltage at node C drops, the amplification of amplifying element $M_2$ is reduced, resulting in less current draw at node A and a corresponding increase in voltage at node A.

The voltage rise at node A is followed by the voltage drop at node B which keeps the circuit operation perfectly stable. The voltage rise at A and drop at B causes a large change in the voltage across inductor $L_1$, thus greatly increasing the Q of inductor $L_1$ which in turn produces a marked improvement in the notch rejection of the filter and the pass-band and stop-band roll-off. The current change at node A is equal and opposite to the current change at node B.

The operation of second differential amplifier pair 322 is identical, but applied across nodes C and D to cause a corresponding increase in the Q of $L_1$ of the second resonant circuit 312.

Figure 4:
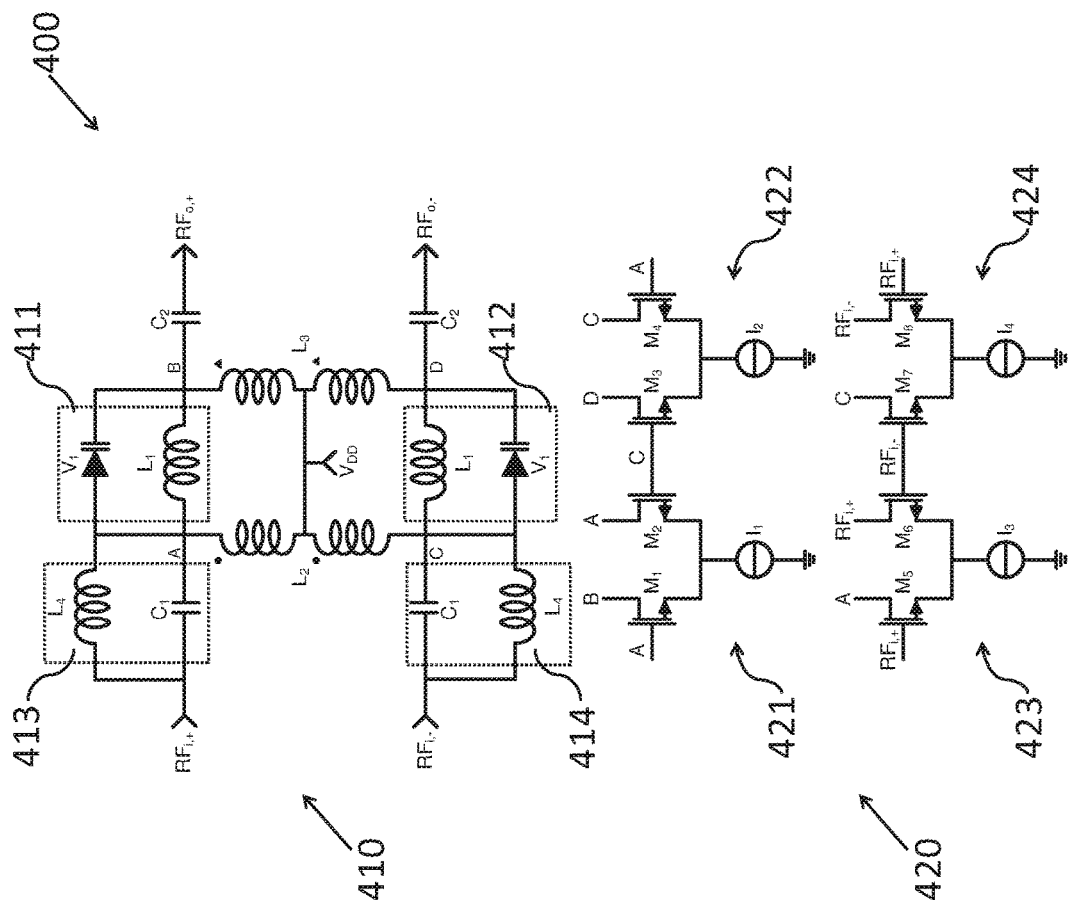
FIG. 4 shows a differential high-pass filter according to another embodiment of the invention, employing a double harmonic trap.

FIG. 4 shows another embodiment which is similar to the embodiment of FIG. 3 except that in the passive filter core 410 each of the positive and negative signal arms of the differential filter includes an additional resonant circuit. In the positive half, in addition to the first resonant circuit 411, a third resonant circuit 413 is formed by putting an inductor $L_4$ in parallel with the previous dc blocking capacitor $C_1$. Similarly, in the negative half, in addition to the second resonant circuit 412, a fourth resonant circuit 414 is formed by putting an inductor $L_4$ in parallel with the previous dc blocking capacitor $C_1$.

In the active circuit 420 an additional set of differential amplifiers is required for Q boosting of the additional inductive components $L_4$. The first differential amplifier 421 and second differential amplifier 422 are identical in operation to the first and second differential amplifiers pairs 421 and 422 of FIG. 3. However, in addition, a third differential amplifier 423 and fourth differential amplifier 424 are provided. The third differential amplifier 423 comprises amplifying elements $M_5$ and $M_6$ connected together at their sources to third current source $I_3$. The fourth differential amplifier 424 comprises amplifying elements $M_7$ and $M_8$ connected together at their sources to fourth current source $I_4$. The third differential amplifier 423 is connected across the third resonant circuit 413 at node A and at non-inverting input $RF_{i,+}$. The gate of $M_5$ is driven by $RF_{i,+}$ and the gate of $M_6$ is driven by $RF_{i,-}$. The fourth differential amplifier 424 is connected across the fourth resonant circuit 414 at node C and at inverting input $RF_{i,-}$. The gate of $M_7$ is driven by $RF_{i,-}$ and the gate of $M_8$ is driven by $RF_{i,-}$.

In FIG. 4, a capacitor (e.g., high-Q MIM cap.) can substitute varactor $V_1$ as shown in FIG. 2. This variation serves to demonstrate that the active circuit may achieve significant gains when a varactor $V_1$ is not used. This would also apply to the active circuit 320 of FIG. 3 when applied to a passive core 310 with the varactor $V_1$ replaced with a capacitor.

Figure 5:
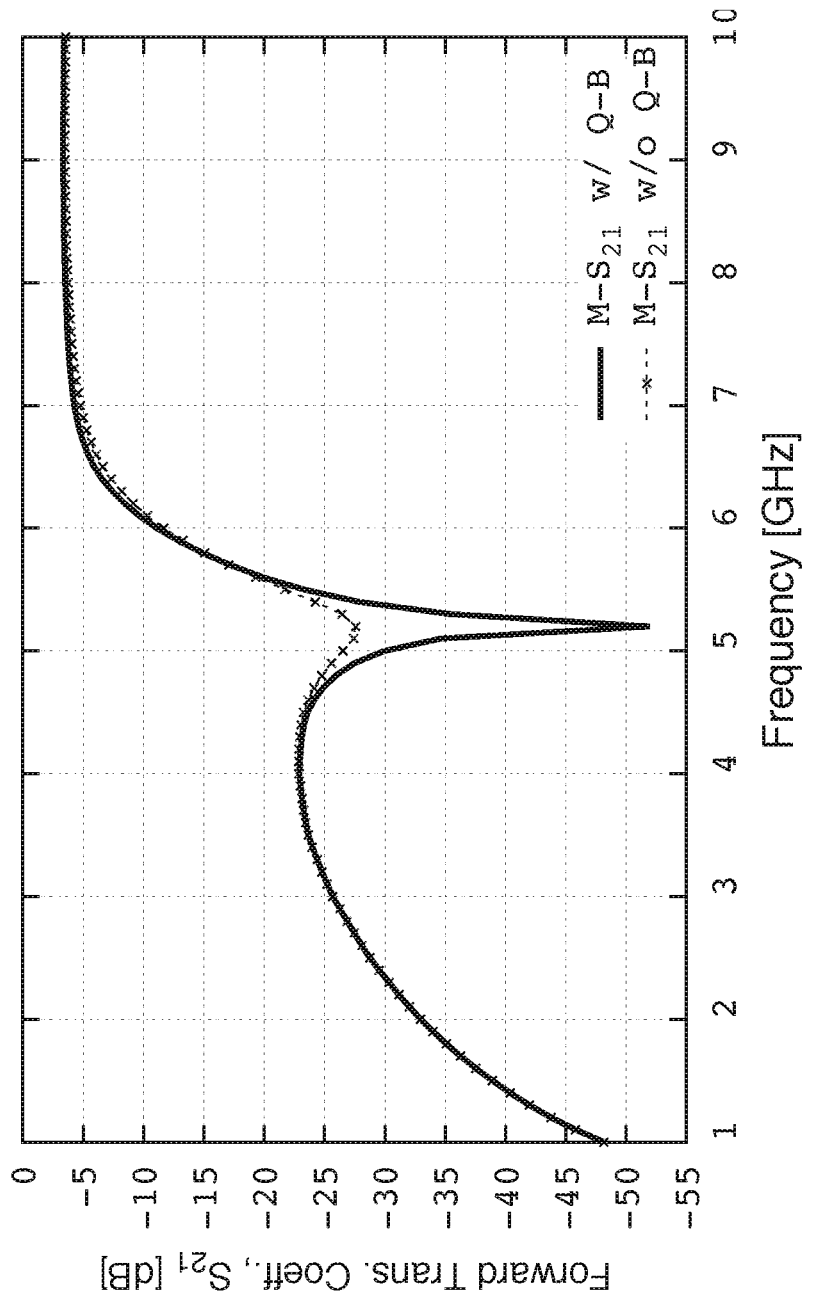
FIG. 5 shows the forward transmission coefficient ($S_{21}$) of the high-pass filter with and without active Q-boosting.

FIG. 5 shows the filter response (forward transmission coefficient $S_{21}$) for a particular setup with a single harmonic trap (i.e., one resonant circuit) placing the notch at around 5.1 GHz. Two lines are shown on the graph, the line marked with line-points shows the response of the filter with the active circuit switched OFF (effectively achieved simply by turning off the current sources $I_1$ and $I_2$). The solid line shows the response of the filter with the active circuit switched ON. The improvement in notch depth and roll-off steepness is readily apparent. With Q-boosting ON (active circuit ON) there is at least 20 dB rejection across the range of about 5 to 5.5 GHz, providing excellent rejection of the IEEE 802.11a wireless LAN band. There is at least 10 dB rejection at 5.8 GHz. The insertion loss in the pass-band is about 3 dB which is comparable to off the shelf components.

Figure 6:
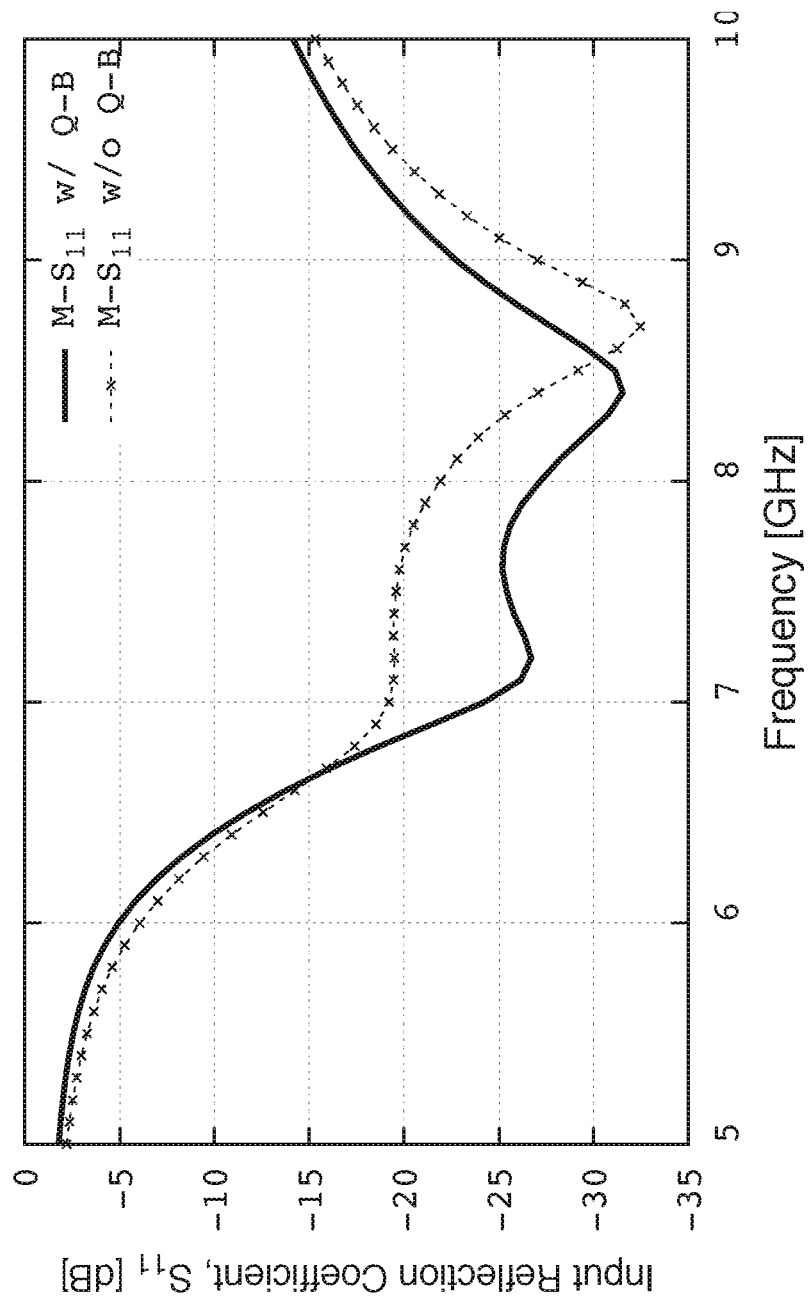
FIG. 6 shows the input reflection coefficient ($S_{11}$) of the high-pass filter with and without active Q-boosting.

FIG. 6 shows the input reflection coefficient $S_{11}$ of the filter. At the input, the filter is differentially matched (i.e., $S_{11}$<−10 dB) to 100Ω over the passband (e.g., 6-8.5 GHz) with Q-boosting (line) enabled and without Q-boosting (line-points).

Figure 7:
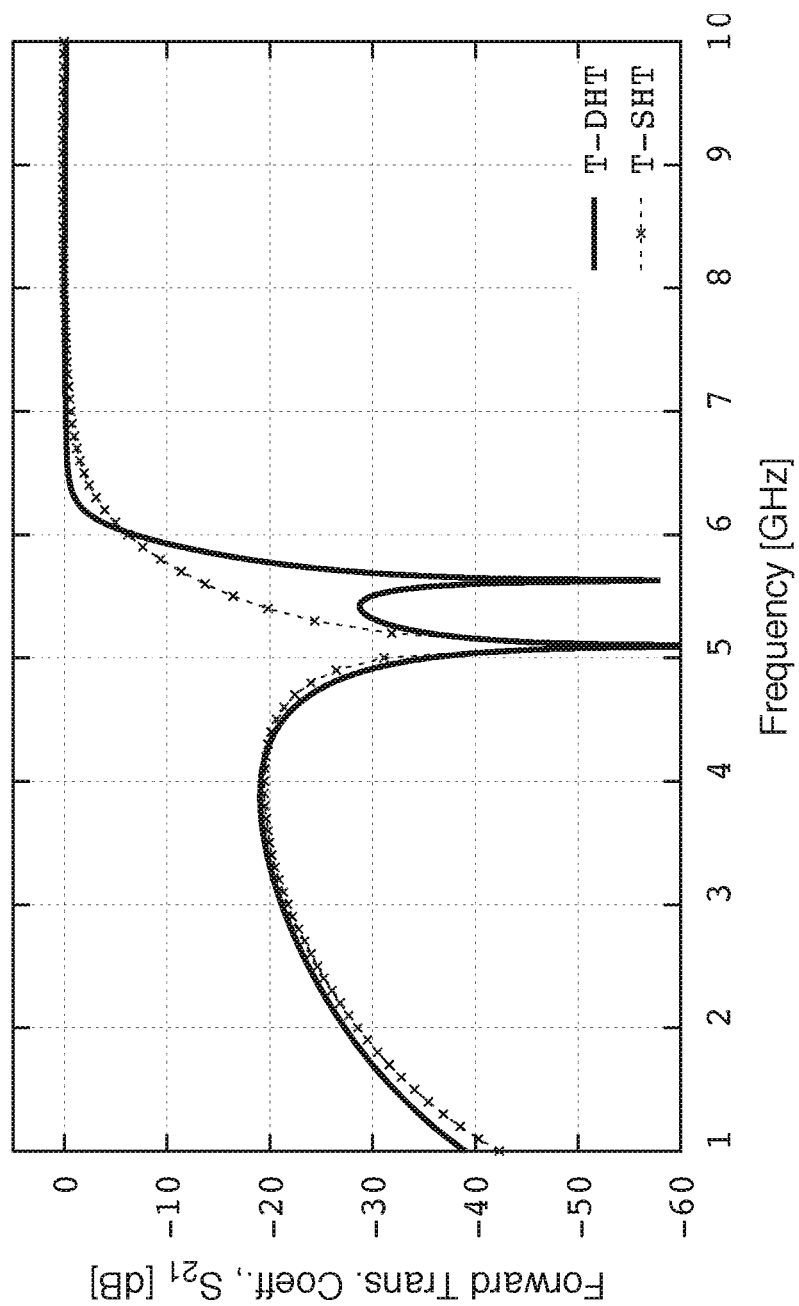
FIG. 7 shows the $S_{21}$ for single and double harmonic trap high-pass filters.

FIG. 7 compares the filter responses ($S_{21}$) for single (line-points) and double harmonic (line) trap elliptic high-pass filters. The double harmonic trap filter with two notches shows a steeper pass-band to stop-band roll-off, thus allowing for one notch to be placed closer to the lower edge of the passband with >20 dB rejection at around IEEE 802.11a.

Figure 8:
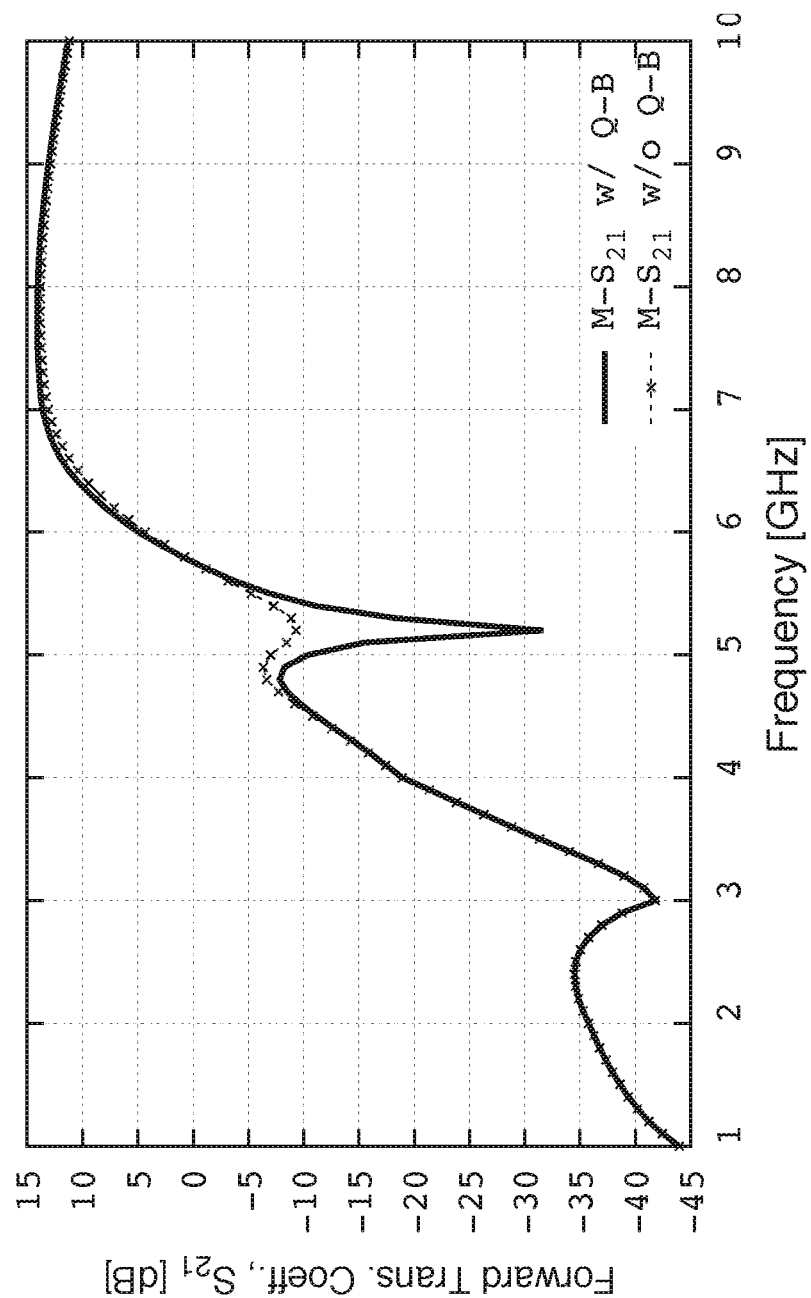
FIG. 8 shows the $S_{21}$ of the high-pass filter (with and without active Q-boosting) when combined with a low-noise amplifier (LNA)
Figure 9:
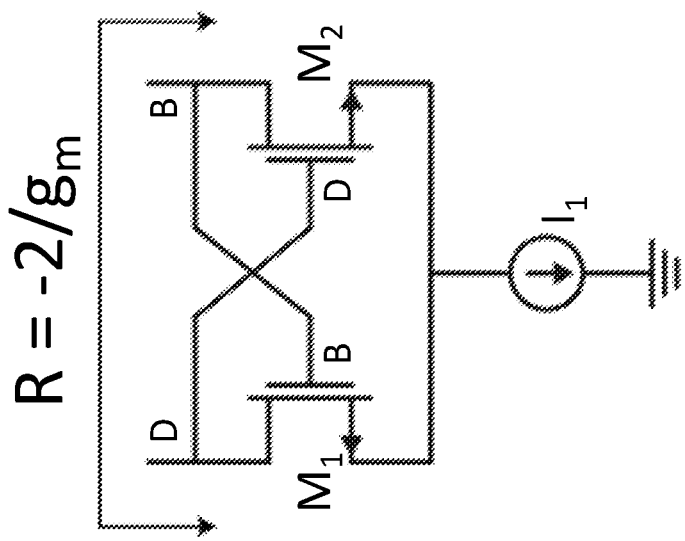
FIG. 9 illustrates a prior art negative-$g_m$ technique.
Figure 9:
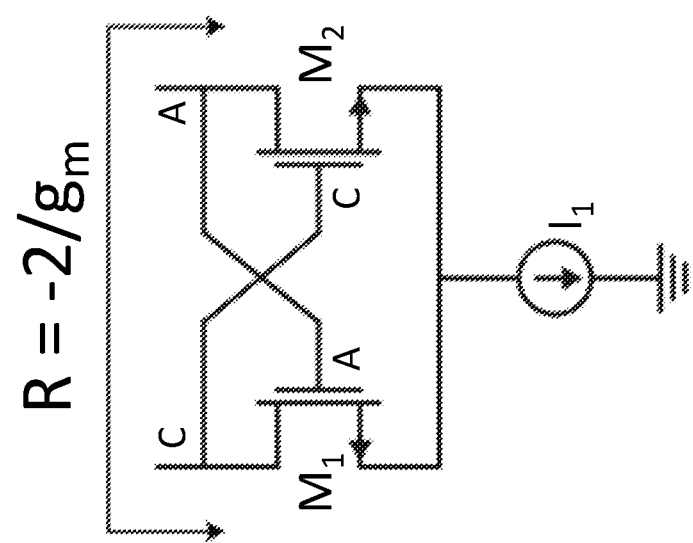

FIG. 5 shows the standalone frequency response of the filter. In practical set ups, the high-pass filter is generally linked to a low-noise amplifier to provide signal gain in the pass-band and out-of-band rejection. FIG. 8 shows the response of the combination of the high-pass filter evaluated in FIG. 4 together with a low-noise amplifier. The results are again shown both with and without the active Q-boosting circuit enabled. Without Q-boosting, the signal rejection is >20 dB at 5.1 GHz (i.e., lower-frequency end of IEEE 802.11a). With Q-boosting enabled, the rejection is >45 dB at 5.1 GHz. Again the roll-off improves with Q-boosting enabled. Combined with the LNA, the rejection at around 2.4 GHz (IEEE 802.11b/g) is >50 dB.

It will be appreciated that many variations of the above embodiments may be made without departing from the scope of the invention which is defined by the appended claims.

The invention claimed is:

1. A differential circuit having a first positive arm and a second negative arm; wherein the first positive arm comprises at least one first reactive component and the second negative arm comprise at least one second reactive component;

further comprising:

an active circuit, the active circuit arranged to increase the ac voltage difference across the first reactive component by changing the current at an input to the first reactive component and the current at an output of the first reactive component by equal and opposite amounts, and the active circuit arranged to increase the ac voltage difference across the second reactive component by changing the current at an input to the second reactive component and the current at an output of the second reactive component by equal and opposite amounts;

wherein the active circuit comprises:

a first current source arranged to draw current through a first amplifying element from the output of the first reactive component and arranged to draw current through a second amplifying element from the input of the first reactive component, the first amplifying element being driven by the input to the first reactive component and the second amplifying element being driven by the input of the second reactive component; and a second current source arranged to draw current through a third amplifying element from the output of the second reactive component and arranged to draw current through a fourth amplifying element from the input of the second reactive component, the third amplifying element being driven by the input of the second reactive component and the fourth amplifying element being driven by the input of the first reactive component.

2. A differential circuit as claimed in claim 1, wherein the first reactive component is part of a first resonant circuit and wherein the second reactive component is part of a second resonant circuit.

3. A differential circuit as claimed in claim 1, wherein a third reactive component is connected between the input of the first reactive component and the input of the second reactive component; and wherein a fourth reactive component is connected between the output of the first reactive component and the output of the second reactive component.

4. A differential circuit as claimed in claim 1, wherein the differential circuit is any of: a high-pass filter, a low-pass filter or an amplifier.

5. A differential circuit as claimed in claim 1, wherein the first, second, third and fourth amplifying elements are inverting amplifiers and arranged in common-source configuration.

6. A differential circuit as claimed in claim 1, wherein the first, second, third and fourth amplifying element are FETs, each being driven by the voltage at its respective gate and with the respective current source being connected to its source.

7. An electronic circuit comprising a resonant circuit formed from an inductive component in parallel with a capacitive component;

wherein the capacitive component is a varactor;

wherein the electronic circuit is arranged for a differential signal and wherein the electronic circuit comprises:

a first resonant circuit formed from an inductive component in parallel with a varactor; and a second resonant circuit formed from an inductive component in parallel with a varactor; and wherein the first resonant circuit is arranged for receiving a positive part of the differential signal and the second resonant circuit is arranged for receiving a negative part of the differential signal.

8. An electronic circuit as claimed in claim 7, wherein an input of the resonant circuit and an output of the resonant circuit are connected to the same dc potential.

9. An electronic circuit as claimed in claim 7, wherein the varactor is optimized for high Q.

10. An electronic circuit as claimed in claim 7, wherein an input of the resonant circuit is connected to a second inductive component and wherein an output of the resonant circuit is connected to a third inductive component.

11. An electronic circuit as claimed in claim 10, wherein the second and third inductive components connect the resonant circuit to the same dc potential.

12. An electronic circuit as claimed in claim 10, wherein the second and third inductive components connect the resonant circuit to different dc potentials.

13. An electronic circuit as claimed in claim 10, wherein the second and third inductive components are inductors or center-tapped inductors or auto-transformers.

14. An electronic circuit as claimed in claim 7, wherein an input of the first resonant circuit is connected to an input of the second resonant circuit through a second inductive component and wherein an output of the first resonant circuit is connected to an output of the second resonant circuit through a third inductive component.

15. An electronic circuit as claimed in claim 14, wherein the second and third inductive components are centre-tapped inductors or autotransformers.

16. An electronic circuit as claimed in claim 15, wherein the centre taps of the second and third inductive components are connected to the same dc potential.

17. An electronic circuit as claimed in claim 7, wherein the electronic circuit is an elliptic filter.

18. An electronic circuit as claimed in claim 7, further comprising an active circuit, the active circuit arranged to increase the ac voltage difference across the first resonant circuit by changing the current at an input to the first resonant circuit and the current at an output of the first resonant circuit by equal and opposite amounts, and the active circuit arranged to increase the ac voltage difference across the second resonant circuit by changing the current at an input to the second resonant circuit and the current at an output of the second resonant circuit by equal and opposite amounts.

19. An electronic circuit as claimed in claim 7, further comprising an active circuit, the active circuit comprising:
a first current source arranged to draw current through a first amplifying element from the output of the first resonant circuit and arranged to draw current through a second amplifying element from the input of the first resonant circuit, the first amplifying element being driven by the input to the first resonant circuit and the second amplifying element being driven by the input of the second resonant circuit; and
a second current source arranged to draw current through a third amplifying element from the output of the second resonant circuit and arranged to draw current through a fourth amplifying element from the input of the second resonant circuit, the third amplifying element being driven by the input of the second resonant circuit and the fourth amplifying element being driven by the input of the first resonant circuit.

20. An electronic circuit as claimed in claim 19, wherein the first, second, third and fourth amplifying elements are inverting amplifiers and arranged in common-source configuration.

21. An electronic circuit as claimed in claim 19, wherein the first, second, third and fourth amplifying elements are FETs, each being driven by the voltage at its respective gate and with the respective current source being connected to its source.

22. A differential circuit having a first positive arm and a second negative arm; wherein the first positive arm comprises at least one first reactive component and the second negative arm comprise at least one second reactive component;
further comprising:
an active circuit, the active circuit arranged to increase the ac voltage difference across the first reactive component by changing the current at an input to the first reactive component and the current at an output of the first reactive component by equal and opposite amounts, and the active circuit arranged to increase the ac voltage difference across the second reactive component by changing the current at an input to the second reactive component and the current at an output of the second reactive component by equal and opposite amounts;
wherein a third reactive component is connected between the input of the first reactive component and the input of the second reactive component; and
wherein a fourth reactive component is connected between the output of the first reactive component and the output of the second reactive component.

* * * * *